(12) United States Patent
Kim et al.

(10) Patent No.: US 11,063,026 B2
(45) Date of Patent: Jul. 13, 2021

(54) DISPLAY MODULE AND METHOD OF MANUFACTURING THE SAME

(71) Applicant: SAMSUNG ELECTRONICS CO., LTD., Suwon-si (KR)

(72) Inventors: Eunhye Kim, Suwon-si (KR); Doyoung Kwag, Suwon-si (KR); Byungchul Kim, Suwon-si (KR); Sangmoo Park, Suwon-si (KR); Minsub Oh, Seoul (KR); Dongyeob Lee, Suwon-si (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/808,558

(22) Filed: Mar. 4, 2020

(65) Prior Publication Data
US 2020/0312822 A1 Oct. 1, 2020

(30) Foreign Application Priority Data

Mar. 29, 2019 (KR) .................. 10-2019-0037132

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01); *H01L 2933/0066* (2013.01)

(58) Field of Classification Search
CPC ............... H01L 25/0753; H01L 33/62; H01L 2933/0066
See application file for complete search history.

(56) References Cited

U.S. PATENT DOCUMENTS

| 8,431,182 B2 * | 4/2013 | Kimura ............ G02F 1/133377 427/66 |
| 8,441,612 B2 | 5/2013 | Ishida et al. |
| 9,142,532 B2 | 9/2015 | Suga et al. |

(Continued)

FOREIGN PATENT DOCUMENTS

| JP | 2011-14593 A | 1/2011 |
| JP | 5720748 B2 | 5/2015 |

(Continued)

OTHER PUBLICATIONS

International Search Report dated Jun. 17, 2020 issued by the International Searching Authority in International Application No. PCT/KR2020/002627 (PCT/ISA/210).

(Continued)

*Primary Examiner* — Victor A Mandala
(74) *Attorney, Agent, or Firm* — Sughrue Mion, PLLC (57) ABSTRACT

A method of manufacturing a display module is provided. The method may include providing a substrate including a pixel region on which a plurality of electrodes are disposed and a peripheral region that is a region other than the pixel region on the substrate; forming an adhesive layer on the pixel region of the substrate; transferring a plurality of micro light emitting diodes (LEDs) onto the adhesive layer; pre-curing the adhesive layer to shift the adhesive layer on the pixel region to the peripheral region; and bonding the plurality of micro LEDs to the plurality of electrodes.

6 Claims, 11 Drawing Sheets

(56) References Cited

U.S. PATENT DOCUMENTS

| | | | |
|---|---|---|---|
| 9,281,255 B2 | 3/2016 | Kawate | |
| 9,941,262 B2 | 4/2018 | Thompson | |
| 10,424,615 B2* | 9/2019 | Wu | H01L 27/156 |
| 2004/0021413 A1* | 2/2004 | Ito | H01L 27/3246 |
| | | | 313/504 |
| 2004/0201048 A1* | 10/2004 | Seki | H01L 27/322 |
| | | | 257/294 |
| 2007/0224713 A1 | 9/2007 | Han et al. | |
| 2010/0328638 A1* | 12/2010 | Ishida | H05K 3/0061 |
| | | | 355/67 |
| 2012/0319152 A1 | 12/2012 | Park et al. | |
| 2013/0222879 A1* | 8/2013 | Kuo | G02B 26/005 |
| | | | 359/290 |
| 2014/0134767 A1 | 5/2014 | Ishida et al. | |
| 2016/0223858 A1* | 8/2016 | Lim | G02F 1/133514 |
| 2018/0053751 A1 | 2/2018 | Zou et al. | |
| 2018/0277591 A1* | 9/2018 | Wu | H01L 33/60 |
| 2019/0244937 A1 | 8/2019 | Honjo et al. | |

FOREIGN PATENT DOCUMENTS

| | | |
|---|---|---|
| JP | 2018-518045 A2 | 7/2018 |
| KR | 10-2015-0006845 A | 1/2015 |
| KR | 10-2018-0112197 A | 10/2018 |
| WO | 2016/175653 A2 | 11/2016 |
| WO | 2017/150257 A1 | 9/2017 |

OTHER PUBLICATIONS

Written Opinion dated Jun. 17, 2020 issued by the International Searching Authority in International Application No. PCT/KR2020/002627 (PCT/ISA/237).

* cited by examiner

DISPLAY MODULE AND METHOD OF MANUFACTURING THE SAME

CROSS-REFERENCE TO RELATED APPLICATION(S)

This application is based on and claims priority under 35 U.S.C. § 119 to Korean Patent Application No. 10-2019-0037132, filed on Mar. 29, 2019, in the Korean Intellectual Property Office, the disclosure of which is incorporated by reference herein in its entirety.

BACKGROUND

1. Field

The disclosure relates to a display module and a method of manufacturing the same, and more particularly, to a display module in which position accuracy of a micro light emitting diode (LED) is improved at the time of bonding the micro LED onto a substrate, and a method of manufacturing the same.

2. Description of Related Art

A semiconductor light emitting diode (LED) is widely used as a light source not only for a light source for a lighting device, but also for display devices of various electronic products, such as a television (TV), mobile phone, desktop personal computer (PC), laptop PC, personal digital assistant (PDA), etc.

In particular, a micro LED having a size of 100 µm or less has been recently developed. The micro LED has a faster response speed, requires less power, and provides higher luminance than a conventional LED, and thus, the micro LED is emerging as a light emitting element of a next generation display.

However, in a manufacturing process of a display module, during a process of bonding the micro LED transferred onto the substrate, the micro LED may be deviated from its predetermined position or spaced apart from an electrode by a non-uniform pressure, and bonded onto the substrate in a non-contact state. This problem in the bonding process of the micro LED may cause defects in the display module.

SUMMARY

Provided are a display module in which accuracy of positioning a micro light emitting diode (LED) bonding onto a substrate is improved and provides an improved bonding process of the micro LED, and a method of manufacturing the same.

In accordance with an aspect of the disclosure, there is provided a method of manufacturing a display module. The method may include providing a substrate including a pixel region on which a plurality of electrodes are disposed and a peripheral region that is a region other than the pixel region on the substrate; forming an adhesive layer on the pixel region of the substrate; transferring a plurality of micro light emitting diodes (LEDs) onto the adhesive layer; pre-curing the adhesive layer to shift the adhesive layer on the pixel region to the peripheral region; and bonding the plurality of micro LEDs to the plurality of electrodes.

A surface energy of the peripheral region is higher than a surface energy of the pixel region.

Each of the plurality of micro LEDs includes a first micro LED configured to emit red light; a second micro LED configured to emit green light; and a third micro LED configured to emit blue light.

The pre-curing of the adhesive layer in the pixel region includes pre-curing the adhesive layer on the pixel region to be shifted to the peripheral region so that the adhesive layer on the peripheral region is thicker than the adhesive layer on the pixel region.

The providing the substrate includes forming a hydrophilic layer in the peripheral region.

The hydrophilic layer is formed of a self-assembled monolayer.

The providing the substrate includes forming a self-assembled monolayer on the substrate; forming on the self-assembled monolayer a photoresist layer corresponding to the pixel region; irradiating the photoresist layer with an ultra violet ray; and removing the photoresist layer.

The providing the substrate further includes forming a hydrophobic layer on a surface of the pixel region by chemical vapor deposition.

The bonding the plurality of micro LEDs on the adhesive layer includes bonding by at least one of weights of the plurality of micro LEDs or pressing on the plurality of micro LEDs.

In accordance with an aspect of the disclosure, there is provided a display module including a substrate including a pixel region on which a plurality of electrodes are disposed and a peripheral region which is more hydrophilic than the pixel region; a plurality of micro light emitting diodes (LEDs) arranged on the pixel region and connected to the plurality of electrodes; and an adhesive layer formed on the substrate and having a convex shape on the peripheral region of the substrate.

The adhesive layer on the peripheral region is thicker than the adhesive layer on the pixel region.

A surface energy of the peripheral region is higher than a surface energy of the pixel region.

Each of the plurality of micro LEDs includes a first micro LED configured to emit red light; a second micro LED configured to emit green light; and a third micro LED configured to emit blue light.

The substrate further includes a hydrophilic layer disposed on the peripheral region.

The hydrophilic layer is formed of a self-assembled monolayer.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the disclosure will more apparent from the following description taken in conjuction with the accompanying drawings, in which.

DETAILED DESCRIPTION

Hereinafter, a light emitting diode (LED) element and a method of manufacturing the LED element according to embodiments of the disclosure are described in detail with reference to the accompanying drawings.

Embodiments described below are illustratively described to assist the understanding of the disclosure, and it is to be understood that the disclosure may be variously modified and executed unlike the embodiments described herein. However, a detailed description hereinafter for the known functions or components related to the disclosure that may unnecessarily obscure the gist of the disclosure may be omitted. Further, the accompanying drawings are not illustrated to actual scale, but sizes of some of components may be exaggerated to assist the understanding of the disclosure.

Terms 'first', 'second' and the like may be used to describe various components, and the components are not to be interpreted to be limited to these terms. These terms may be used to differentiate one component from other components. For example, a 'first' component may be named a 'second' component, and the 'second' component may also be similarly named the 'first' component, without departing from the scope of the disclosure.

Terms used in herein may be interpreted as carrying the same meanings as generally known to those skilled in the art unless otherwise defined.

In addition, terms such as 'above', 'below', 'fore end', 'rear end', 'upper portion', 'lower portion', 'upper end', 'lower end' and the like may be defined with reference to the drawings. However, the shapes and positions of respective components are not limited to these terms.

Figure 1:
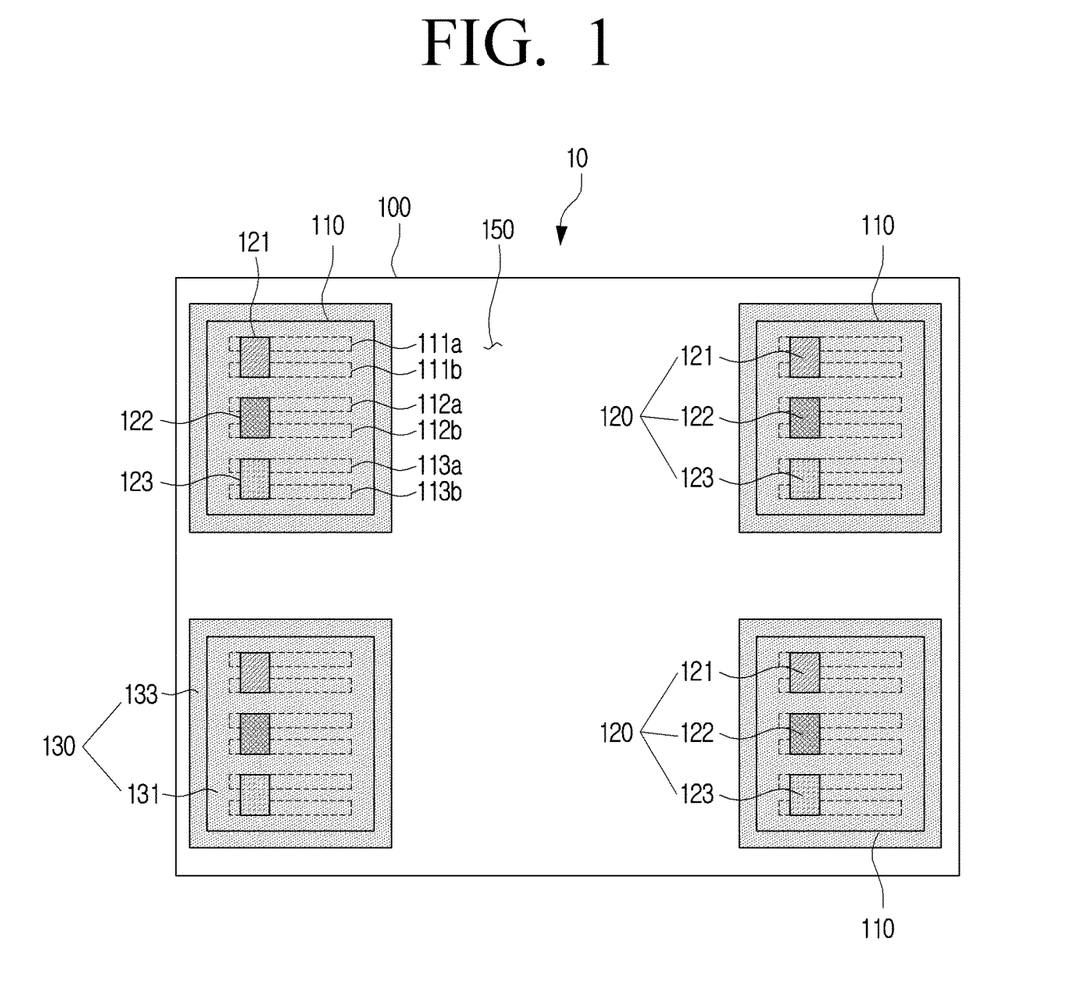
FIG. 1 is a plan view schematically showing a portion of a display module according to an embodiment.

FIG. 1 is a plan view schematically showing a portion of a display module according to an embodiment.

The display module according to an embodiment of the disclosure may be applied to an electronic product or an electronic device that requires a wearable device, a portable device, a handheld device, or various displays, in a single unit. The display module can also be applied to a small display device such as a monitor for a personal computer, a TV, etc. and a large display device such as a digital signage, an electronic display through a plurality of assembly arrangements.

Although there are a plurality of display modules 10 in a display, the following description focuses on a single display module 10 for convenience of explanation.

Referring to FIG. 1, the display module 10 may include a micro light emitting diode (LED) 120, a substrate 100 on which the micro LEDs 120 are arranged in a lattice form, and an adhesive layer 130 formed on the substrate 100.

The micro LED 120 may be formed of an inorganic light emitting material having a size of 100 µm or less in width, length and height, and be disposed on the substrate 100 to radiate light by itself.

Each of the micro LEDs 120 may include: a first micro LED 121 configured to emit red light, a second micro LED 122 configured to emit green light, and a third micro LED 123 configured to emit blue light.

In addition, the first, second and third micro LEDs 121, 122 and 123 may be sequentially arranged on the substrate 100. However, such an arrangement of the micro LEDs is an example, and each set of the first micro LED 121, the second micro LED 122 and the third micro LED 123 may be arranged in various forms on a pixel region 110.

Accordingly, the first, second and third micro LEDs 121, 122 and 123 may form one pixel and implement various colors.

The first, second and third micro LEDs 121, 122, and 123, which are sub-pixels on the substrate 100, may be collectively configured as one pixel.

The micro LED 120 has a faster response speed, lower power consumption, and higher luminance than the conventional LEDs, and thus, the micro LED is emerging as a light emitting element of a next generation display. Also, the micro LED 120 has a higher efficiency of converting electricity into a photon than the conventional liquid crystal display (LCD) and organic light emitting diode (OLED) display.

That is, the micro LED 120 has a higher "brightness per watt" than the conventional LCD and OLED displays. Accordingly, the micro LED 120 may produce the same brightness with about half of the energy required of the conventional LED or OLED display.

In addition, the micro LED 120 may implement a high resolution with improved color, contrast and brightness, and thus accurately expresses a wide range of colors, and may provide a clear screen even in the bright sunlight. In addition, the micro LED 120 may be endure a burn-in phenomenon and generate less heat, thereby ensuring its prolong life without deformation.

The substrate 100 may be electrically connected to each of the micro LEDs 120 mounted in a matrix form on the substrate 100 and control the micro LEDs 120 through a control signal of a processor.

Types of the substrate 100 may include a thin film transistor (TFT) substrate, a wafer, a printed circuit board (PCB), a flexible printed circuit board (flexible PCB) and the like.

In addition, the substrate 100 may be formed of various materials, such as glass, plastic, etc.

The substrate 100 may have the pixel region 110 and a peripheral region 150.

The pixel region 110 is a region which emits light when a predetermined power is applied to the first, second and third micro LEDs 121, 122 and 123 forming one pixel.

The substrate 100 may have a plurality of pixel regions 110 formed in a matrix form, and a region other than the plurality of pixel regions 110 may be the peripheral region 150.

Each of the pixel regions 110 may include a pixel driving circuit driving the first micro LED 121, the second micro LED 122 and the third micro LED 123.

Each of the pixel regions 110 may be electrically connected to the micro LED 120 and may include a plurality of electrodes 111a, 111b, 112a, 112b, 113a and 113b, which are arranged at predetermined intervals on the pixel region 110. For example, each of the pixel regions 110 may include the electrodes 111a and 111b electrically connected to the first micro LED 121, the electrodes 112a and 112b electrically connected to the second micro LED 122, and the electrodes 113a and 113b electrically connected to the third micro LED 123. Hereinafter, the electrodes 111a, 111b, 112a, 112b, 113a and 113b are treated as being identical, and therefore the description focuses on the electrodes 111a and 111b formed on the first micro LED 121.

The electrodes 111a and 111b may be a pair of electrodes. For example, the electrodes may include one power electrode and one common electrode, but may not be limited thereto. The electrodes may include two power electrodes.

The first electrode 111a and the second electrode 111b may have different potentials, and may be disposed so that they are not in physical contact with each other to maintain a constant potential difference.

The plurality of electrodes 111a and 111b may be made of a conductive material, and may be electrically connected to a plurality of connection pads of the micro LED 120, respectively.

The first micro LED 121 disposed on the electrodes 111a and 111b may be electrically connected to the pixel driving circuit through the electrodes 111a and 111b. Power may be supplied to the electrodes 111a and 111b so that the micro LED 121 may emit light.

Figure 2:
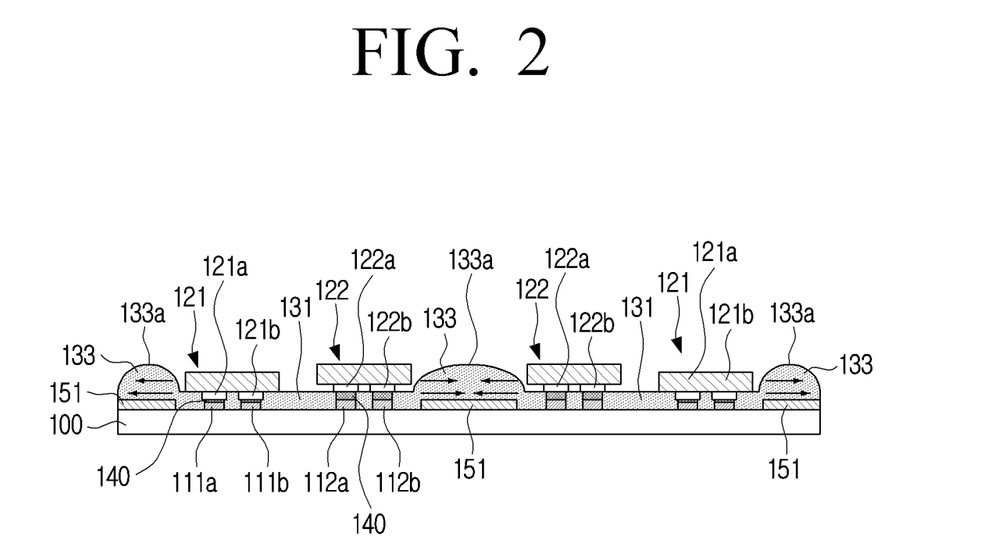
FIG. 2 is a cross-sectional view of the display module shown in FIG. 1 according to an embodiment.

The pixel region 110 may be surrounded by the peripheral region 150. The peripheral region 150 may be formed on some regions of the substrate 100 which is hydrophilic, or may be formed by providing a hydrophilic layer 151 (as shown in FIG. 2), including hydrophilic material, on the substrate 100.

The pixel region 110 may be formed to be more hydrophobic than the peripheral region 150, and the peripheral region 150 may be formed to be more hydrophilic than the pixel region 110. That is, a top surface of the pixel region 110 may be a hydrophobic surface, and a top surface of the peripheral region 150 may be a hydrophilic surface.

The peripheral region 150 is more hydrophilic than the pixel region 110, and thus, may have a relatively higher surface energy than the pixel region 110. Accordingly, the pixel region 110 and the peripheral region 150 may have different surface energy.

An adhesive layer 130 pre-cured in a manufacturing process of the display module 10 may be moved from the pixel region 110 to the peripheral region 150 having the relatively higher surface energy. Specifically, the pre-cured adhesive layer 130 may be in a state of a gel having fluidity, and the peripheral region 150 may have high intermolecular attraction, as it has high surface energy. That is, the peripheral region 150 may attract the pre-cured adhesive layer 130, and the pre-cured adhesive layer 130 may be easily moved from the pixel region 110 to the peripheral region 150. As moved by the surface energy difference between the pixel region 110 and the peripheral region 150, the pre-cured adhesive layer 130 may include a first adhesive layer 131 disposed on the pixel region 110 and a second adhesive layer 133 disposed on the peripheral region 150.

The display module 10 according to the disclosure may be applied to a wearable device, a portable device, a handheld device as a single unit and to electronic products that require various displays. In addition, the display module 10 may be a matrix type applicable to a display device, such as a personal computer monitor, a high-resolution TV, a signage, and an electronic display through a plurality of assembly arrangements.

Hereinafter, referring to FIG. 2, the description focuses on a detailed configuration of the display module 10 including the adhesive layer 130.

FIG. 2 is a cross-sectional view of the display module shown in FIG. 1 according to an embodiment.

Referring to FIG. 2, the display module 10 may include the substrate 100, the plurality of micro LEDs 121 and 122, and the adhesive layers 131 and 133 disposed on the substrate 100. For convenience of description, only the first micro LED 121 and the second micro LED 122 are described below. Here, the first micro LED 121 is an example of the micro LED, but is not limited to the micro LED emitting red light. Similarly, the second micro LED 122 is an example of the micro LED, and is not limited to the micro LED emitting green light.

The hydrophilic layer 151 may be formed on the peripheral region 150 of the substrate 100. The peripheral region 150 may be more hydrophilic than the pixel region 110 due to the hydrophilic layer 151. That is, the peripheral region 150 may be more hydrophilic than the pixel region 110 on which a separate surface treatment is not performed.

The peripheral region 150 is more hydrophilic than the pixel region 110, and therefore the surface energy of the peripheral region 150 may be relatively higher than that of the pixel region 110.

FIG. 2 shows that the hydrophilic layer 151 is formed on the peripheral region 150, and is not limited thereto. For example, a hydrophobic layer may be formed on the pixel region 110 without the hydrophilic layer 151 being formed on the peripheral region 150. Alternatively, the hydrophilic layer 151 may be formed on the peripheral region 150, and the hydrophobic layer may be formed on the pixel region 110.

A first connection pad 121a and a second connection pad 121b may be disposed on one surface of the first micro LED 121 mounted on the pixel region 110 at a predetermined interval. Similarly, a first connection pad 122a and a second connection pad 122b may be disposed on one surface of the second micro LED 122 at a predetermined interval.

The first and second connection pads 121a and 121b formed on the first micro LED 121 and the first and second connection pads 122a and 122b formed on the second micro LED 122 are the same. Therefore, the description hereinafter focuses on the first and second connection pads 121a and 121b formed on the first LED 121.

The first connection pad 121a and the second connection pad 121b may be conductive pads, for example, metal pads.

The first connection pad 121a and the second connection pad 121b may have different potential values to drive the micro LED 121.

In addition, the first connection pad 121a may be a p-pad, and the second connection pad 121b may be an n-pad. However, the pads are not limited thereto, for example, the first connection pad 121a may be the n-pad, and the second connection pad 121b may be the p-pad.

In addition, the first connection pad 121a and the second connection pad 121b may be disposed on the same surface of the first micro LED 121. That is, the first micro LED 121 may be a flip chip. Similarly, the plurality of micro LEDs 120 may be flip chips.

The connection pads 121a and 121b may be electrically connected to the electrodes 111a and 111b formed on the substrate, respectively. Specifically, the first and second connection pads 121a and 121b of the first micro LED 121 may be in direct contact with and bonded to the first and second electrodes 111a and 111b, respectively.

Furthermore, as in the case of the second micro LED 122, intermetallic compounds (IMCs) 140 may be formed between the plurality of connection pads 122a and 122b and the plurality of electrodes 112a and 112b. The first connection pad 122a and the second connection pad 122b may be respectively bonded to the first electrode 112a and the second electrode 112b through the IMCs 140 serving as a medium. That is, the second micro LED 122 may be firmly bonded onto the substrate 100 by the IMCs 140 serving as a kind of adhesive.

As described above, the display module 10 may include the adhesive layer 130 disposed on the substrate 100. The adhesive layer 130 may include the first adhesive layer 131 disposed on the pixel region 110 and the second adhesive layer 133 disposed on the peripheral region 150.

The first adhesive layer 131 disposed on the pixel region 110 may be formed to fill a gap between the plurality of micro LEDs 121 and 122 and the substrate 100. Specifically, the first adhesive layer 131 may be disposed to surround surfaces of the connection pads 121a and 121b of the first micro LED 121 and the electrodes 111a and 111b, which are in direct contact with the first adhesive layer 131. In addition, the first adhesive layer 131 may be disposed to surround both the surfaces of the IMCs 140 which are respectively formed between the connection pads 122a and 122b of the second micro LED 122 and the electrodes 112a and 112b, and the surfaces of the electrodes 112a and 112b.

In addition, the first adhesive layer 131 may fill a gap between the first connection pad 121a and the first electrode 111a and a gap between the second connection pad 121b and the second electrode 111b to prevent an electrical short. Accordingly, the first adhesive layer 131 may drive the micro LED 120 to be electrically stable.

In addition, the first adhesive layer 131 may be disposed to surround the surfaces of the IMCs 140 to prevent cracking of the IMCs 140 which are weak against an impact, thereby stably bonding the micro LEDs 120 onto the substrate 100.

The first adhesive layer 131 may be formed to have a substantially flat top surface.

According to an embodiment, the second adhesive layer 133 disposed on the peripheral region 150 may be stacked on the hydrophilic layer 151.

For example, the second adhesive layer 133 may be formed to have a convex top surface. A top surface 133a of the second adhesive layer 133 may be disposed to be lower than top surfaces of the micro LEDs 121 and 122. However, the shape and position of the second adhesive layer 133 is not limited thereto.

In addition, the second adhesive layer 133 cured to have a convex shape on the peripheral region 150 may be formed to partially surround the outermost portions of the plurality of micro LEDs 121 and 122 disposed on the pixel region 110. That is, the second adhesive layer 133 may stably fix the plurality of micro LEDs 121 and 122 on the pixel region 110.

The second adhesive layer 133 may have a thicker thickness than the first adhesive layer 131. The second adhesive layer 133 may be formed in such a manner that the adhesive layer 130 disposed on the pixel region 110 is shifted to the peripheral region 150 during the manufacturing process of the display module 10, and a greater amount of resin may be accumulated on the peripheral region 150 adjacent to the pixel region 110 toward a center of the peripheral region 150.

The first adhesive layer 131 may have a minimized thickness. Accordingly, the display module 10 may have a minimized thickness by minimizing the thickness of the pixel region 110 on which the micro LED 120 is mounted. Accordingly, the second adhesive layer 133 may be etched to have the same thickness as that of the first adhesive layer 131.

The adhesive layer 130 may include a flux agent for implementing a fluxing function.

The adhesive layer 130 may be formed of a non-conductive material. For example, the adhesive layer 130 may be formed of a thermosetting resin. The thermosetting resin may include as its main component, an epoxy resin, phenol resin, polyimide resin, polyurethane resin, melamine resin and urea resin.

For example, the flux agent F may include various fluxes, such as an inorganic flux including zinc chloride based flux or zinc chloride-ammonia chloride based flux, an organic flux including glutamate hydrochloride urea or ethylene diamine stearic acid hydrochloride, a rosin-based flux including inactive rosin or active rosin, a water soluble flux including salt, acid or amine, etc.

Accordingly, the adhesive layer 130 may fill the gap between the plurality of electrodes 111a and 111b, thereby preventing the electrodes 111a and 111b from being electrically connected to each other to cause the electrical short.

It may be assumed that the plurality of electrodes 111a and 111b and the plurality of connection pads 121a and 121b of the micro LED 121 are electrically connected to each other, respectively. In this case, the adhesive layer 130 including the flux agent may allow the flux agent F to reduce a portion of oxidized surfaces connecting the plurality of electrodes 111a and 111b with the first and second connection pads 121a and 121b of the micro LED 121, respectively. Simultaneously, the adhesive layer 130 may allow the flux agent F to be pushed by the plurality of electrodes 111a and 111b and the first and second connection pads 121a and 121b in which a coating film is melted. In this manner, it is possible to prevent oxidation of the plurality of electrodes 111a and 111b and the first and second connection pads 121a and 121b.

In addition, the flux agent may be disposed to surround the surfaces of the plurality of electrodes 111a and 111b and the first and second connection pads 121a and 121b of the micro LED 121 to isolate the connecting surfaces from an outside. As such, it is possible to prevent oxidation of the surfaces connecting the plurality of electrodes 111a and 111b with the first and second connection pads 121a and 121b, respectively.

Furthermore, the adhesive layer 130 may be formed by mixing a flux agent with the epoxy resin.

It may be assumed that the adhesive layer 130 is pre-cured in the manufacturing process of the display module 10. In this case, the adhesive layer 130 disposed on the pixel region 110 may be shifted to the peripheral region 150 to reduce the thickness of the adhesive layer 130 disposed on the pixel region 110. That is, the adhesive layer 130 disposed between the plurality of electrodes 111a and 111b and the plurality of connection pads 121a and 121b may be shifted to easily bond the micro LED 121 onto the plurality of connection pads 121a and 121b on the substrate 100.

Accordingly, it is possible to minimize a pressure applied to the micro LEDs 121 and 122 in a bonding process of the micro LEDs 120 during the manufacturing process of the display module 10. Therefore, it is possible to solve the problem in which the micro LEDs 121 and 122 are deviated from predetermined positions or spaced apart from the electrodes 111a and 111b due to a non-uniform pressure, and bonded to the electrodes 111a and 111b in a non-contact state.

Hereinafter, the description focuses on a method of manufacturing the display module 10 according to an embodiment.

Figure 3:
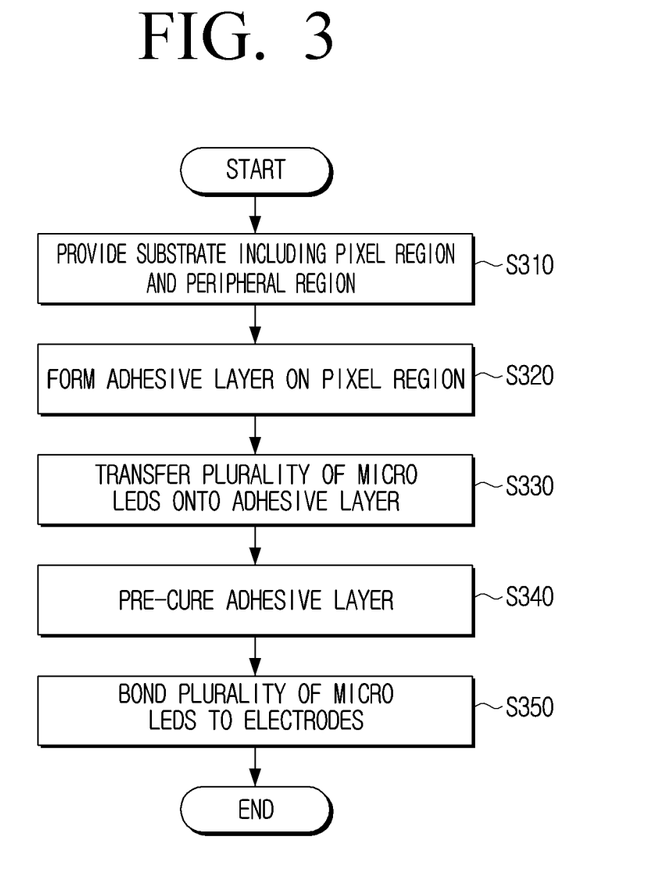
FIG. 3 is a flowchart showing a method of manufacturing a display module according to an embodiment.

FIG. 3 is a flowchart showing a method of manufacturing a display module according to an embodiment.

Referring to FIG. 3, a method of manufacturing a display module according to an embodiment may include providing a substrate 100 including a pixel region 110 and a peripheral region 150 (S310); forming an adhesive layer 310 on the pixel region 110 on the substrate 100 (S320); transferring a plurality of micro LEDs 120 onto the adhesive layer 310 (S330); pre-curing the adhesive layer 130 (S340); and bonding the plurality of micro LEDs 120 to the electrodes 111a and 111b of the pixel region 110 (S350). Hereinafter, the manufacturing process of the display module according to an embodiment will be described in detail with reference to FIGS. 4-11.

Figure 4:
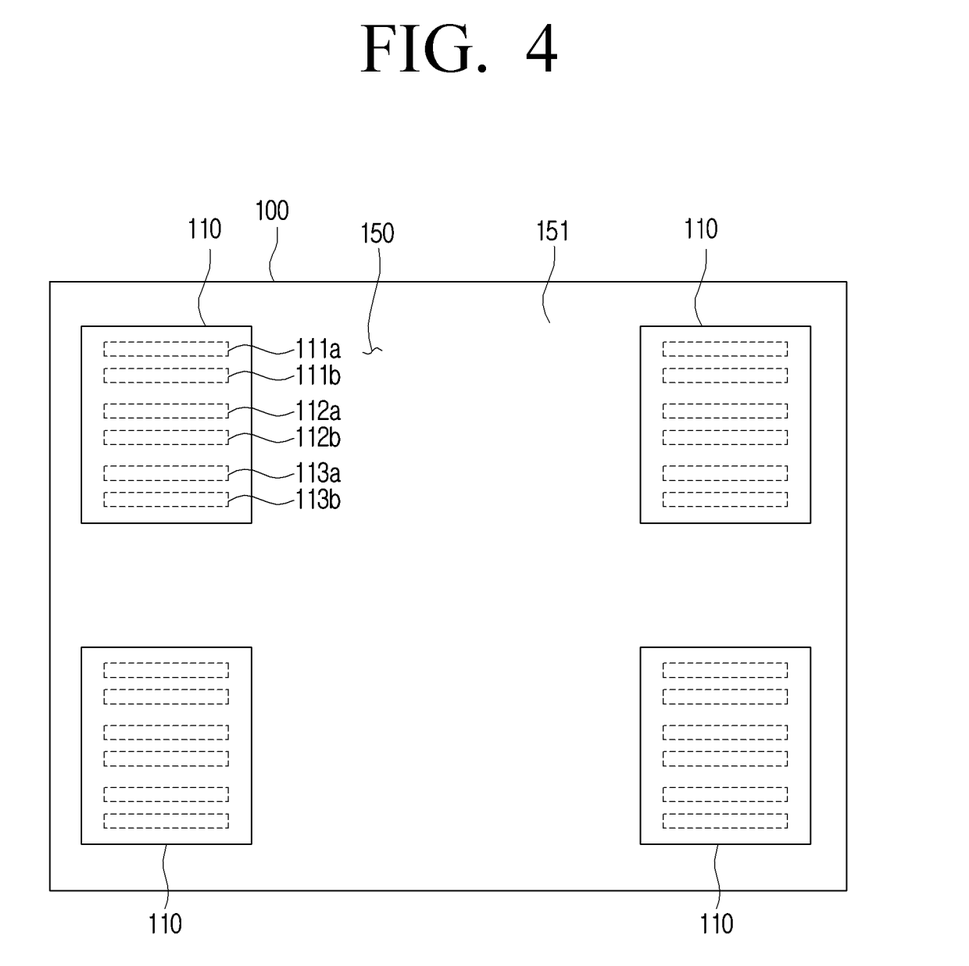
FIG. 4 is a plan view showing a substrate including a pixel region and a peripheral region according to another embodiment.

FIG. 4 is a plan view showing a substrate 100 including a pixel region 110 and a peripheral region 150 according to another embodiment.

Referring to FIG. 4, a plurality of electrodes 111a, 111b, 112a, 112b, 113a and 113b may be formed on the substrate 100. The plurality of electrodes 111a, 111b, 112a, 112b, 113a and 113b may be formed on the pixel region 110 on which the micro LED 120 is disposed.

According to an embodiment, a peripheral region 150 may be formed to be more hydrophilic than the pixel region 110 on the substrate 100. That is, the pixel region 110 may be formed to be relatively more hydrophobic than the peripheral region 150. In other words, the substrate 100 may have the pixel region 110 and the peripheral region 150 having differences in the surface energy. Here, the pixel region 110 may have a relatively higher surface energy than the peripheral region 150.

Hereinafter, a method of forming the substrate 100 including the peripheral region 150 which is more hydrophilic than the pixel region 110 will be described.

Figure 5:
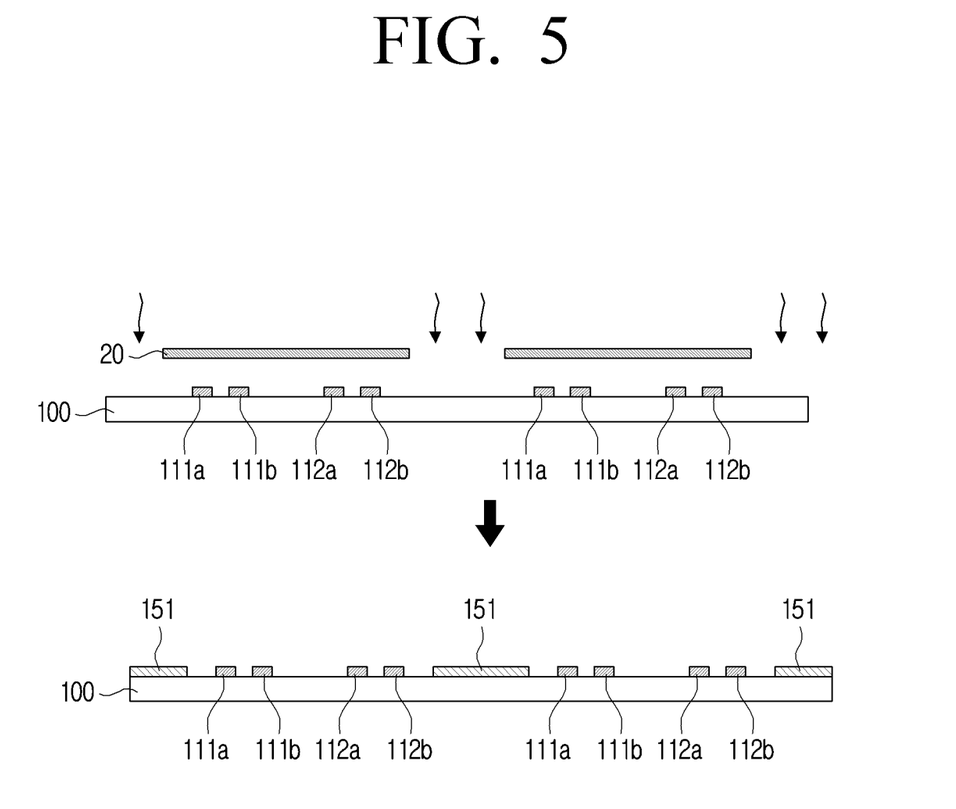
FIG. 5 is a cross-sectional view showing a forming process of a substrate according to an embodiment.

FIG. 5 is a cross-sectional view showing a forming process of a substrate according to an embodiment.

Referring to FIG. 5, the peripheral region 150 may have an electrical property different from that of the pixel region 110 by including the hydrophilic layer 151 formed on the peripheral region 150 of the substrate 100.

First, a photoresist layer 20 may be disposed on a portion corresponding to the pixel region 110 of the substrate 100, and then a hydrophilic layer 151 may be disposed on the substrate 100. Then, the photoresist layer 20 may be removed. Here, the hydrophilic layer 151 formed on the photoresist layer 20 may be removed together with the photoresist layer 20. Therefore, the hydrophilic layer 151 may not remain on a portion where the photoresist layer 20 was disposed, and a surface of the substrate 100 may thus be exposed. Accordingly, the pixel region 110 on which the photoresist layer 20 is removed, may have difference in the surface energy compared to the peripheral region 150 on which the hydrophilic layer 151 is formed.

The pixel region 110 on which the substrate 100 is exposed may be more adaptive to the adhesive layer 130 than the peripheral region 150 on which the hydrophilic layer 151 is formed. In other words, the bare surface of the substrate 100 in the pixel region 110 may be more susceptible to dispose the adhesive layer 130 than the peripheral region 150 on which the hydrophilic layer 151 is formed. Accordingly, during a pre-curing process of the adhesive layer 130, the adhesive layer 130 may be shifted to the peripheral region 150 so that the second adhesive layer 133 of the peripheral region 150 is thicker than the first adhesive layer 131 of the pixel region 110.

Therefore, the surface energies may be different in the peripheral region 150 including the hydrophilic layer 151 and the pixel region 110 not including the hydrophilic layer 151. Based on the difference, the adhesive layer 130 disposed on the pixel region 110 may have a reduced thickness by the pre-curing process of the adhesive layer 130.

Meanwhile, it is described that the hydrophilic layer 151 is formed on the peripheral region 150 to provide the substrate 100 including the peripheral region 150 that is more hydrophilic than the pixel region 110. However, the substrate 100 is not limited hereto. A portion of a top surface of the substrate 100 corresponding to the pixel region 110 may be surface-treated to be hydrophobic to form a hydrophobic layer on the pixel region 110.

The hydrophobic layer formed on the pixel region 110 may be formed by a chemical vapor deposition (CVD) method.

Figure 6:
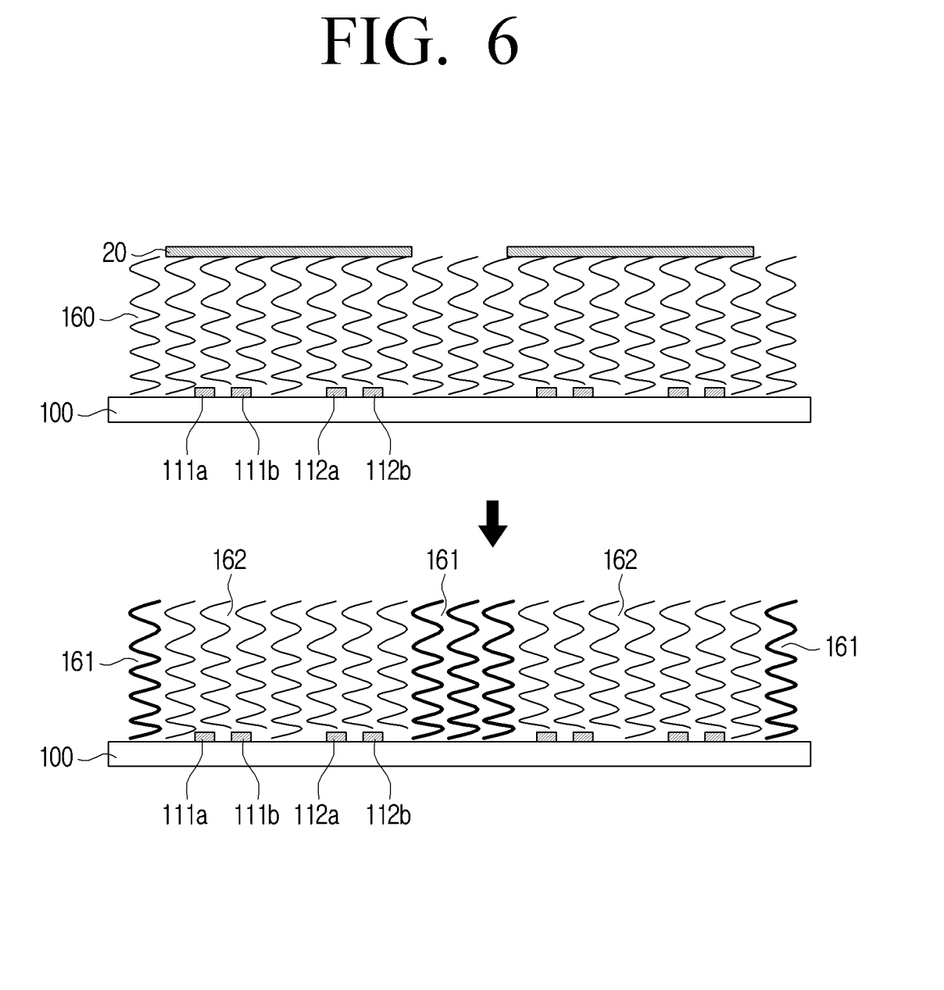
FIG. 6 is a cross-sectional view showing a forming process of a substrate according to another embodiment.

FIG. 6 is a cross-sectional view showing a forming process of a substrate according to an embodiment.

Referring to FIG. 6, it is possible to provide the substrate 100 including the peripheral region 150 which is more hydrophilic than the pixel region 110 by forming a self-assembled monolayer (SAM) 160 on the substrate 100. Specifically, the SAM 160 may be formed on the entire of the substrate 100 and then the photoresist layer 20 may be formed on a portion corresponding to the pixel region 110 of the formed SAM 160. Ultraviolet ray (UV) may then be radiated onto the photoresist layer 20, and the photoresist layer 20 may then be removed.

A first self-assembled monolayer (SAM) 161 positioned outside the photoresist layer 20 and exposed to the UV radiation may be oxidized and thus have increased hydrophilicity. Accordingly, the first SAM 161 disposed on the peripheral region 150 exposed to the UV radiation may be more hydrophilic than a second self-assembled monolayer (SAM) 162 disposed on the pixel region 110.

Figure 7:
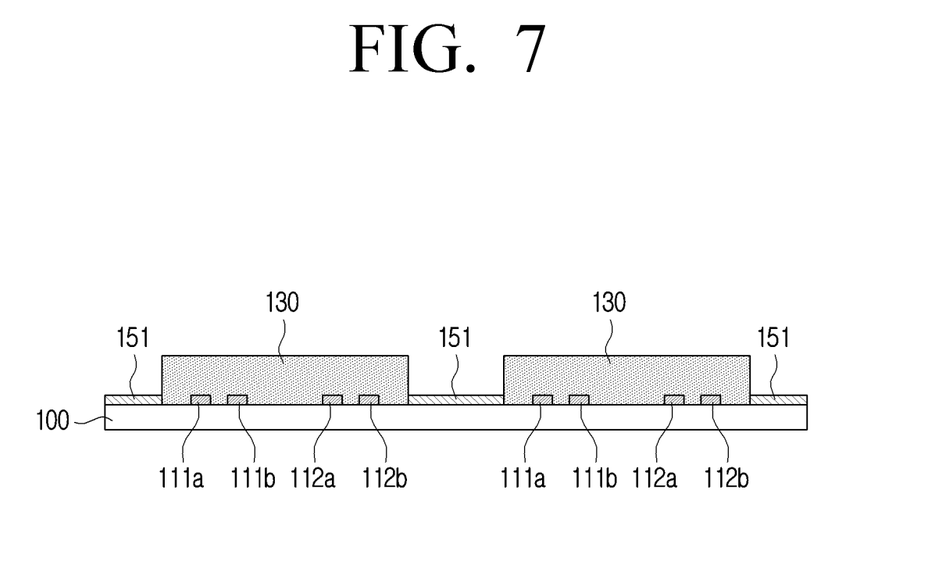
FIG. 7 is a cross-sectional view showing a forming process of an adhesive layer according to an embodiment.

FIG. 7 is a cross-sectional view showing a forming process of an adhesive layer according to an embodiment.

Referring to FIG. 7, the adhesive layer 130 may be formed on the substrate 100. Here, the adhesive layer 130 may have a certain viscosity.

The adhesive layer 130 may be disposed on the pixel region 110. As shown in FIG. 7, the adhesive layer 130 may be disposed on the electrodes 111a, 111b, 112a and 112b arranged at predetermined intervals on the pixel region and the substrate 100.

Here, the adhesive layer 130 may be formed to have a predetermined height to stably support the micro LED 120 transferred onto the substrate 100.

Figure 8:
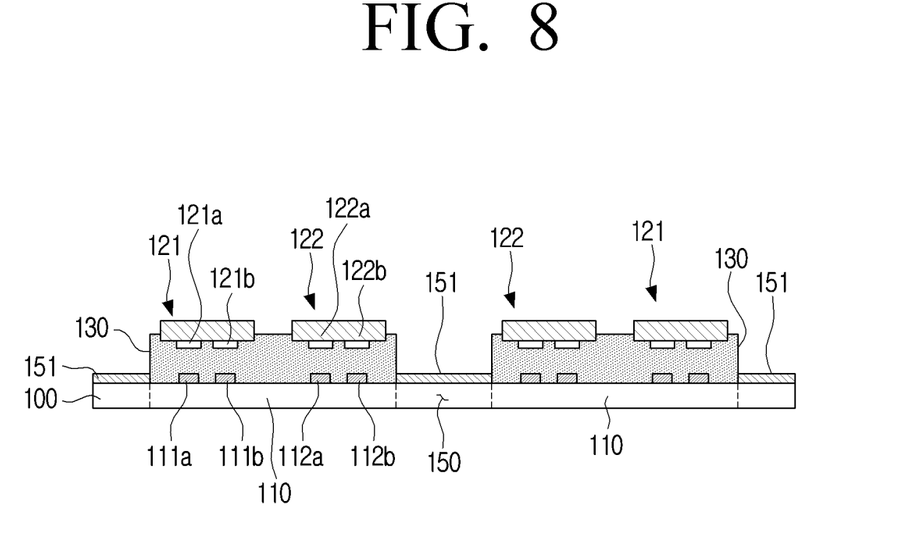
FIG. 8 is a cross-sectional view showing a transferring process of a plurality of micro LEDs onto a substrate according to an embodiment.

FIG. 8 is a cross-sectional view showing a transferring process of a plurality of micro LEDs onto a substrate according to an embodiment.

Referring to FIG. 8, the micro LEDs 121 and 122 may be transferred onto the substrate 100 on which the adhesive layer 130 is formed. The micro LEDs 121 and 122 may be transferred onto the adhesive layer 130. Specifically, the first micro LED 121 may be transferred to a position where the plurality of connection pads 121a and 121b correspond to the plurality of electrodes 111a and 111b on the substrate 100, respectively. Similarly, the second micro LED 122 may be transferred to a position where the plurality of connection pads 122a and 122b correspond to the plurality of electrodes 112a and 112b on the substrate 100, respectively.

The micro LEDs 121 and 122 may be stably transferred onto the substrate 100 by the adhesive layer 130 having the predetermined height.

Figure 9:
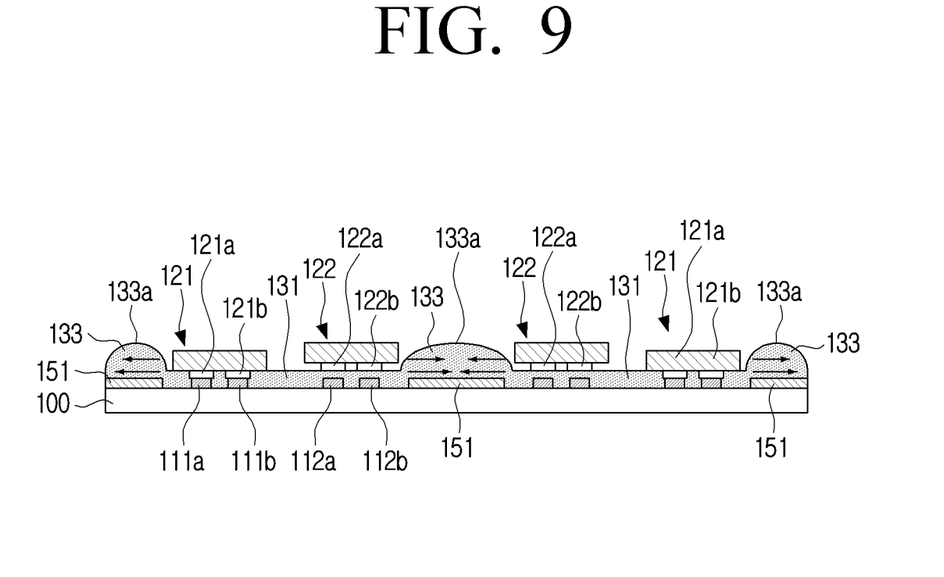
FIG. 9 is a cross-sectional view showing a pre-curing process of an adhesive layer according to an embodiment.

FIG. 9 is a cross-sectional view showing a pre-curing process of an adhesive layer according to an embodiment.

Referring to FIG. 9, the adhesive layer 130 may be heat-treated after the micro LEDs 121 and 122 are transferred. The adhesive layer 130 may be pre-cured by the heat-treatment. The heat-treatment may be performed at a temperature lower than a temperature at which the adhesive layer 130 is cured.

The adhesive layer 130 formed on the pixel region 110 may have a viscosity increased to a certain level by its pre-curing process. That is, the adhesive layer 130 may have a changed physical property, and thus may be in a state of a gel having fluidity.

A portion of the pre-cured adhesive layer 130 on the surface of the pixel region 110 may be shifted to the peripheral region 150 due to a surface property (e.g., the hydrophobicity) of the pixel region 110. As the pre-cured adhesive layer 130 is shifted, the adhesive layer 130 may include the first adhesive layer 131 remaining on the pixel region 110 and the second adhesive layer 133 shifted to the peripheral region 150.

As a portion of the adhesive layer 130 of the pixel region 110 is shifted to the peripheral region 150, the first adhesive layer 131 remaining on the pixel region 110 may become thinner. As such, the adhesive layer disposed between the connection pads 121a and 121b and the electrodes 111a and 111b may shift to the peripheral region 150. Therefore, the connection pads 121a and 121b of the first micro LED 121 and the electrodes 111a and 111b disposed on the substrate 100 may come into contact with each other, respectively.

On the other hand, in a case of the second micro LED 122, the first adhesive layer 131 may remain between the connection pads 122a and 122b and the electrodes 112a and 112b, respectively. In this case, the first adhesive layer 131 may be formed to have a thinner thickness than the adhesive layer 130 before pre-cured.

Accordingly, the micro LEDs 121 and 122 may be easily bonded onto the substrate 100 in the bonding process.

The second adhesive layer 133 formed in the peripheral region 150 may be in a convex shape. The second adhesive layer 133 may be stacked on a surface of the hydrophilic layer 151.

After the micro LEDs 121 and 122 are stably transferred onto the substrate 100, a portion of the adhesive layer 130 in the pixel region 110 may be moved to the peripheral region 150. The first adhesive layer 131 disposed on the pixel region 110 may thus be formed to have a thinner thickness than the initially disposed adhesive layer 130. In this manner, the micro LEDs 121 and 122 may be efficiently bonded onto the substrate 100.

The peripheral region 150 may be formed to have a contact angle of 90° or less, and the pixel region 110 may be formed to have a contact angle of 90° or more. The contact angle may refer to an angle formed when a liquid is thermodynamically balanced on a solid surface. The peripheral region 150 having a low contact angle may have a relatively higher surface energy and a hydrophilic property. Whereas, the pixel region 110 having a high contact angle may have a relatively lower surface energy and a hydrophobic property.

Accordingly, the pre-cured adhesive layer 130 disposed on the pixel region 110 may be shifted to the peripheral region 150 to disperse the adhesive layer 130 on the substrate 100 depending on the desired characteristic of the surface energy.

The adhesive layer 130 in the pre-cured state may be shifted from the pixel region 110 to the peripheral region 150 by the desired difference in the surface energies of the pixel region 110 and the peripheral region 150.

The surface energy may refer to a force attracting an external material by attraction of molecules in the outermost layer of the surface of a material. A higher surface energy may mean a higher intermolecular attraction at an interface of the material, and a higher surface energy may also increase surface tension at the interface of the material. Therefore, the higher the surface energy of the peripheral region 150 of the substrate 100, the smaller the contact angle of the adhesive layer 130 moved onto the hydrophilic layer 151 of the peripheral region 150. It is thus possible to improve mobility of the adhesive layer 130 to the peripheral region 150.

Accordingly, the adhesive layer 130 formed on the pixel region 110 having the relatively lower surface energy may be collected by the peripheral region 150 having the relatively higher surface energy.

Figure 10:
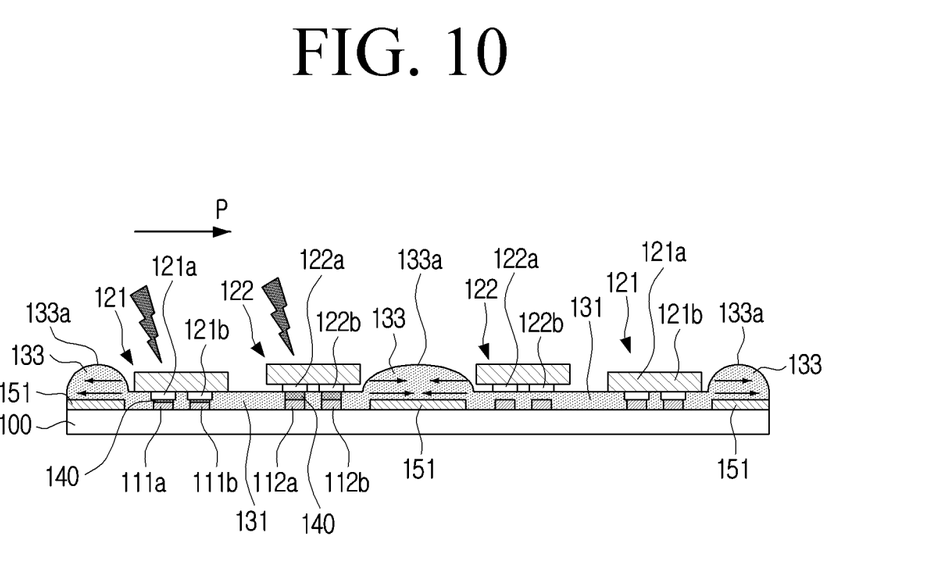
FIG. 10 is a cross-sectional view showing a bonding process of a micro LED according to an embodiment.

FIG. 10 is a cross-sectional view showing a bonding process of a micro LED according to an embodiment.

Referring to FIG. 10, a partial heat-treatment may be performed on the plurality of micro LEDs 121 and 122 arranged on the substrate 100 in a P direction to be electrically and physically connected onto the substrate 100.

As the adhesive layer 130 disposed on the pixel region 110 is dispersed by the pre-curing process of the adhesive layer 130, the micro LED 121 may be positioned to bring the connection pads 121a and 121b into contact with the electrodes 111a and 111b, respectively, by weight of the micro LED 121 itself. In this case, it is possible to omit a pressing process of the micro LED 120 for bring the connection pads 121a and 121b into contact with the electrodes 111a and 111b, respectively.

With regard to the remaining micro LED 122, the first adhesive layer 131 may be disposed between the connection pads 122a and 122b and the electrodes 112a and 112b, respectively. Therefore, the connection pads 122a and 122b and the electrodes 112a and 112b may not be in contact with each other, respectively. Even in this case, the first adhesive layer 131 respectively disposed between the connection pads 122a and 122b and the electrodes 112a and 112b may be formed to have a thin thickness by the pre-curing process of the adhesive layer 130. Therefore, the pressing process of the micro LED 120 may be omitted and the connection pads 121a and 121b and the electrodes 111a and 111b may be respectively connected to each other by the heat-treatment.

By omitting the pressing process of the micro LEDs 120, it is possible to prevent the problem of the micro LEDs 121 and 122 being deviated from their desired positions or being damaged.

Furthermore, when the electrodes 111a and 111b in respective contact with the connection pads 121a and 121b of the first micro LED 121 are heat-treated by a heat source, the electrodes 111a and 111b may be partially melted to form IMCs 140. The first micro LED 121 may be bonded onto the substrate 100 by the IMCs 140. That is, the first micro LED 121 may be electrically and physically connected to the substrate 100.

Similarly, the second micro LED 122 may be heat-treated by the heat source moving in the P direction. The electrodes 112a and 112b heated by the heat source may be partially melted to form the IMCs 140 between the connection pads 122a and 122b and the electrodes 112a and 112b, respectively. Accordingly, the second micro LED 122 may be electrically and physically connected to the substrate 100.

The heat source may be a lamp or a UV laser. The heat source may move in the P direction, and a separate heat-treatment may be performed locally on the micro LEDs 121 and 122.

In addition, as the plurality of micro LEDs 121 and 122 are heat-treated, the first and second adhesive layers 131 and 133 may be cured. Accordingly, a separate process is not required to cure the adhesive layer 130, thereby reducing manufacturing time and cost of the display module.

The heat-treatment in the bonding process of the micro LEDs 120 may be performed at a temperature approximately higher than the temperature at the pre-curing process of the adhesive layer 130.

Figure 11:
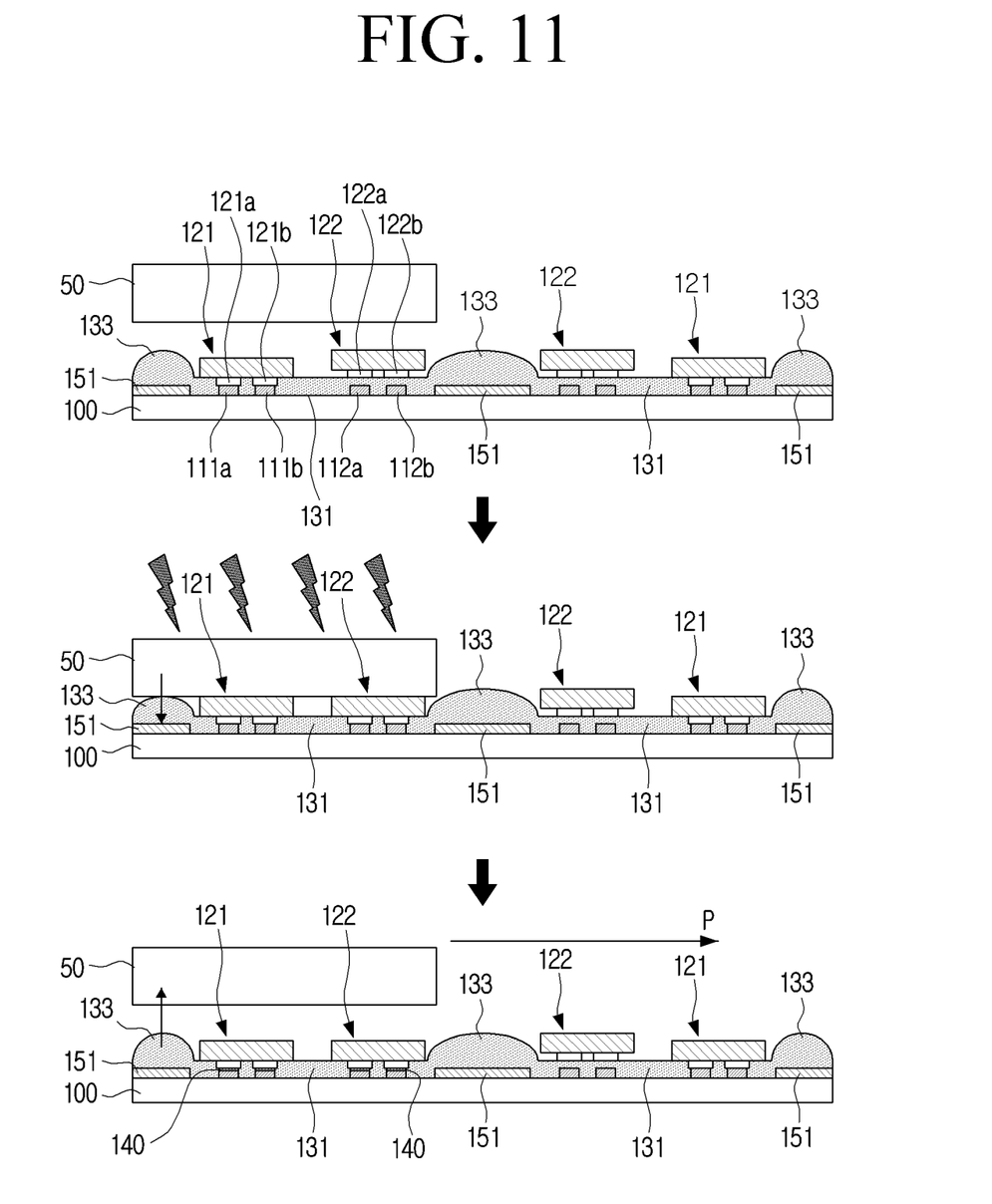
FIG. 11 is a cross-sectional view showing a bonding process of a micro LED according to another embodiment.

FIG. 11 is a cross-sectional view showing a bonding process of a micro LED according to another embodiment.

Referring to FIG. 11, the plurality of micro LEDs 121 and 122 disposed on the substrate 100 may be pressed and heat-treated, in the P direction to be electrically and physically connected to the substrate 100.

Specifically, the pressure may be applied to a top surface of the micro LED 120 using a pressing plate 50.

However, during the pre-curing process of the adhesive layer 130, the micro LED 121 may be positioned to bring the connection pads 121a and 121b in contact with the electrodes 111a and 111b, respectively, by the weight of the micro LED 121 itself. The remaining micro LED 122 may minimize the pressure of its pressing process due to a thin thickness of the first adhesive layer 131 respectively disposed between the connection pads 122a and 122b and the electrodes 112a and 112b.

In a case of pressing the micro LEDs 121 and 122, the pressing plate 50 may move in the P direction by moving a stage. By this pressing plate 50, the micro LEDs 121 and 122 may be locally pressed, and the micro LEDs 121 and 122 may thus be bonded onto the substrate 100 separately from each other.

The plurality of micro LEDs 120 may be pressed and then some of the micro LEDs 120 may be heat-treated.

In the case of the micro LED 120, the IMCs 140 may be respectively formed between the connection pads 121a and 121b and the electrodes 111a and 111b by the heat-treatment, and may electrically and physically connect the micro LED 120 onto the substrate 100. By the IMCs 140, the micro LED 120 may be bonded onto the substrate 100.

In this case, the first and second adhesive layers 131 and 133 may be cured. The first adhesive layer 131 may be cured in a form surrounding outer circumferential surfaces of the connection pads 121a and 121b and the electrodes 111a and 111b. The second adhesive layer 133 may be cured in the convex shape on the hydrophilic layer 151 on the peripheral region 150.

In the method of manufacturing the display module 10 according to an embodiment of the disclosure, the substrate 100 having the surface energy difference is used and the adhesive layer 130 is pre-cured, such that the first adhesive layer 131 disposed between the connection pads 121a and 121b and the electrodes 111a and 111b, respectively, may be partially removed and the thickness of the first adhesive layer 131 disposed between the connection pads 122a and 122b and the electrodes 112a and 112b, respectively, may be minimized.

Accordingly, it is possible to omit the pressing process of the micro LEDs 120 in its bonding process or minimize the pressure in its pressing process. Accordingly, it is possible to prevent problems in which the micro LEDs are deviated from their desired positions or damaged by the pressing operation during the bonding process.

In addition, it is possible to minimize the thickness of the first adhesive layer 131 on the pixel region by the pre-curing process of the adhesive layer 130 and thus minimize the thickness of the display module 10.

It is also possible to reduce the manufacturing costs by simplifying the bonding process of the micro LEDs 120.

Hereinabove, the disclosure is described using an illustrative method. It is to be understood that terms used herein are provided to describe the embodiments of the present disclosure rather than limiting the disclosure. One of ordinary skill in the art may make various modifications and alternations of the embodiments disclosed herein without departing from the principles and spirit of the present disclosure.

What is claimed is:

1. A display module comprising:
a substrate including a pixel region on which a plurality of electrodes are disposed and a peripheral region which is more hydrophilic than the pixel region;
a plurality of micro light emitting diodes (LEDs) arranged on the pixel region and connected to the plurality of electrodes; and
an adhesive layer formed on the substrate and having a convex shape on the peripheral region of the substrate.

2. The display module of claim 1, wherein the adhesive layer on the peripheral region is thicker than the adhesive layer on the pixel region.

3. The display module of claim 1, wherein a surface energy of the peripheral region is higher than a surface energy of the pixel region.

4. The display module of claim 1, wherein each of the plurality of micro LEDs comprises:
a first micro LED configured to emit red light;
a second micro LED configured to emit green light; and
a third micro LED configured to emit blue light.

5. The display module of claim 1, wherein the substrate further comprises a hydrophilic layer disposed on the peripheral region.

6. The display module of claim 5, wherein the hydrophilic layer is formed of a self-assembled monolayer.

* * * * *